United States Patent
Hung et al.

(10) Patent No.: US 9,257,362 B2
(45) Date of Patent: Feb. 9, 2016

(54) HEAT DISSIPATION MODULE WITH HEAT PIPE

(71) Applicant: GIGA-BYTE TECHNOLOGY CO., LTD., New Taipei (TW)

(72) Inventors: Wen Chi Hung, New Taipei (TW); Tung Lin Tsai, New Taipei (TW); Wen Ke Huang, New Taipei (TW); Bo Han Huang, New Taipei (TW); Tzu Chun Su, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 356 days.

(21) Appl. No.: 13/945,902

(22) Filed: Jul. 19, 2013

(65) Prior Publication Data
US 2014/0321059 A1    Oct. 30, 2014

(30) Foreign Application Priority Data
Apr. 26, 2013    (TW) .............................. 102207784 A

(51) Int. Cl.
*H05K 7/20* (2006.01)
*H01L 23/427* (2006.01)
*H01L 23/40* (2006.01)
*H01L 23/367* (2006.01)

(52) U.S. Cl.
CPC .......... *H01L 23/427* (2013.01); *H01L 23/4006* (2013.01); *H01L 23/3672* (2013.01); *H01L 2924/0002* (2013.01)

(58) Field of Classification Search
CPC ............ H01L 23/3672; H01L 23/4006; H01L 23/427; H05K 7/20
USPC ..................... 361/700, 687, 679.47
See application file for complete search history.

(56) References Cited

U.S. PATENT DOCUMENTS

| | | | | |
|---|---|---|---|---|
| 6,125,035 A | * | 9/2000 | Hood, III ................ | G06F 1/203 165/104.33 |
| 6,233,146 B1 | * | 5/2001 | Gilchrist ................ | G06F 1/203 257/E23.088 |
| 2003/0230398 A1 | * | 12/2003 | Lee ..................... | F28D 15/0266 165/104.21 |
| 2004/0257770 A1 | * | 12/2004 | Hu ...................... | H01L 23/4093 361/704 |
| 2006/0291170 A1 | * | 12/2006 | Hsiao ...................... | G06F 1/20 361/704 |

* cited by examiner

*Primary Examiner* — Dion R Ferguson
*Assistant Examiner* — Mandeep S Buttar
(74) *Attorney, Agent, or Firm* — Chun-Ming Shih

(57) ABSTRACT

A heat dissipation module configured on a substrate having a heat producing element thereon includes a holder configured on the substrate and a heat sink having a base opposite to the heat producing element and pivotally connected to the holder and capable of joining to the substrate with the heat producing element covered by the base.

4 Claims, 6 Drawing Sheets

HEAT DISSIPATION MODULE WITH HEAT PIPE

CROSS-REFERENCE TO RELATED APPLICATIONS

This application claims the benefit of the filing date of Taiwan Patent Application No. 12207784, filed on Apr. 26, 2013, in the Taiwan, the disclosure of which is incorporated herein in its entirety by reference.

FIELD OF THE INVENTION

The invention relates to a heat dissipation module, and in particular, to a heat dissipation module with a heat pipe.

DESCRIPTION OF THE PRIOR ART

With the remarkable advances in the high-tech industry, the current trend is toward miniaturization and maximum integration of electronic devices. Under this situation, an increasing heat generation rate may be expected. As should be appreciated, too much heat can lead to failures in the operation of electronic devices. Therefore, a good heat dissipation module is required to remove the waste heat generated by the electronic devices more efficiently for maintaining the stability, preventing the breakdown and prolonging the service life thereof.

Many people enjoy building their own desktop computers from commercial off-the-shelf (COTS) components rather than purchased as a complete system from a computer system supplier. It is inevitable for such group of people to disassemble computers for the purpose of maintenance or replacement. As some electronic devices such as central processing unit (CPU) and graphics processing unit (GPU) gradually involve higher and higher throughput computing or operation, more efficient and powerful processor chips are therefore required to be compatible therewith and to have a better performance. However, it is both time-consuming and difficult to replace the processor chips whenever necessary for a DIY repair user since a conventional heat dissipation module around the processor chips usually include a large number of components. This increases complexity in the process of disassembly or assembly of the processor chips and is not favorable for a DIY repair user.

Therefore, there is a need for the electronics manufactures or system-provider company to develop a heat dissipation module which could be detached and assembled from the electronic devices very easily, effortlessly, and rapidly, thereby facilitating the replacement of processor chips of the CPUs or GPUs in the electronic devices.

SUMMARY OF THE INVENTION

In view of the forgoing, the present invention discloses a heat dissipation module with a heat pipe to solve the above problems. The heat dissipation module enables an easy assembly and disassembly from the electronic device and further facilitates the replacement of the chips located around the heat dissipation module.

The heat dissipation module configured on a substrate having a heat producing element thereon includes a holder configured on the substrate and having two side plates opposite to each other; and a heat sink composed of a base opposite to the heat producing element, a fin structure, and a plurality of heat pipes connected between the base and the fin structure, in which the heat sink is pivotally connected to the holder and capable of joining to the substrate with the heat producing element covered by the base.

With the pivotal connection between the heat sink and the holder, the heat sink composed of the base, fin structure, and heat pipes which are joined together is allowed to pivot about a substrate, such as a circuit board, from an open configuration to a closed configuration. Thus, the CPU, GPU or integrated circuit can be replaced easily in an efficient way without detaching the whole heat dissipation module, which is convenient and practical for a DIY repair user or homebuilt computer user.

The characteristics, realization and functions of the invention are disclosed in the following description with reference to the preferred exemplified embodiments and the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION OF THE INVENTION

In the following description of preferred embodiments, reference is made to the accompanying drawings which form a part hereof, and in which it is shown by way of illustration specific embodiments in which the invention can be practiced. It is to be understood that other embodiments can be used and structural changes can be made by those skilled in the art without departing from the scope of the embodiments of this invention to fit various commercial electronic devices such as all-in-one PCs or notebooks.

Figure 1:
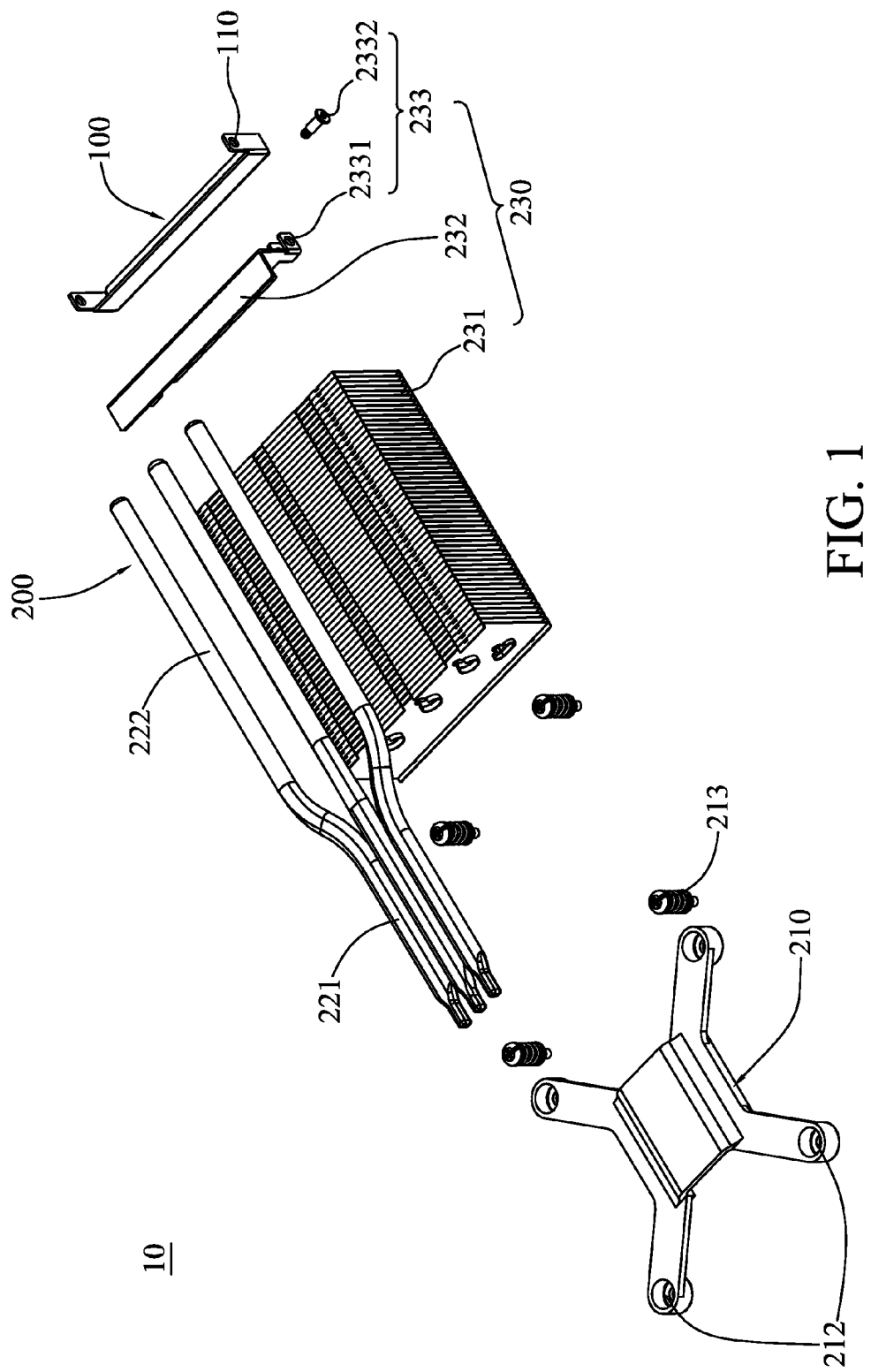
FIG. 1 is an exploded view of the heat dissipation module according to a first embodiment of the present invention.
Figure 2:
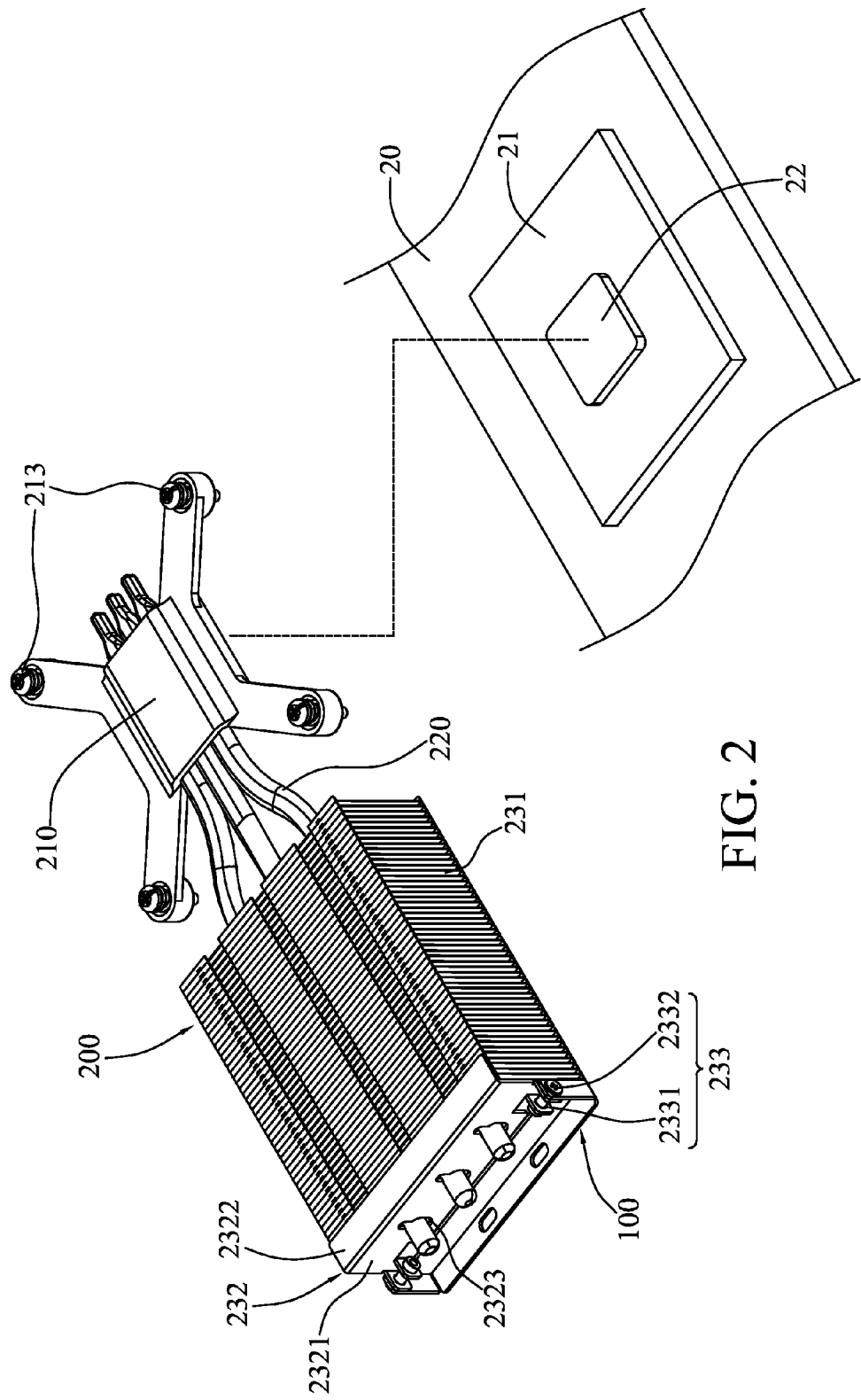
FIG. 2 is an assembling view of the heat dissipation module according to the first embodiment of the present invention.

FIGS. 1 to 3 are respectively an exploded view, assembling view, and side view of the heat dissipation module 10 according to a first embodiment of the present invention. The heat dissipation module 10 is configured on a substrate 20 of an electronic device for dissipating heat generated by a heat producing element 22 on the substrate 20. The substrate 20 may be, but not limited to, a housing of or a motherboard inside the electronic device. In this embodiment, the substrate 20 is exemplified by the housing of the electronic device. A circuit board 21 is provided on the substrate 20, and the heat producing element 22 is provided on the circuit board 21. By way of example, the heat producing element 22 may be a central processing unit (CPU), graphics processing unit (GPU), or the like that generates considerable amount of heat during operation thereof.

Figure 3A:
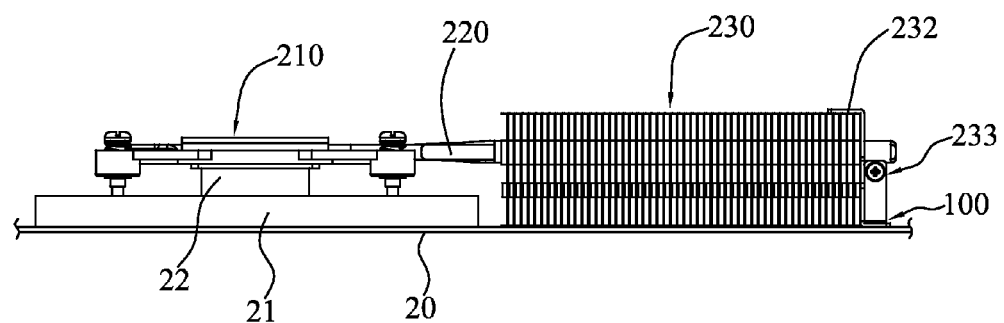
FIGS. 3A and 3B are schematic side view illustrating usage of the heat dissipation module according to the first embodiment of the present invention.
Figure 3B:
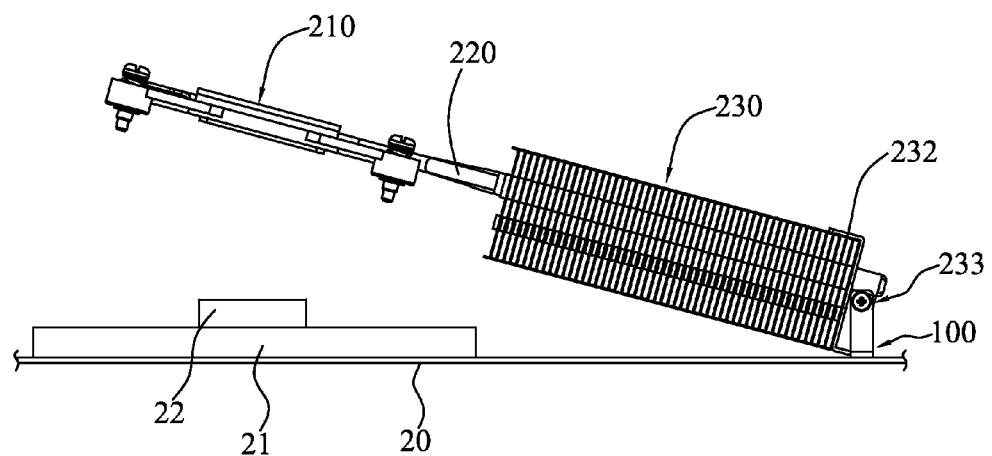

The heat dissipation module 10 in this embodiment includes a holder 100 and a heat sink 200. The holder 100 is disposed on the substrate 20 (the housing of the electronic device) via a fastener such as screw, latch, buckle, rivet, and the like and spaced apart from the circuit board 21. The heat sink 200 includes a base 210, a fin structure 230, and a plurality of heat pipes 220 connected therebetween. Also, the heat sink 200 is pivotally connected to the holder 100 via an end of the fin structure 230, such that a length of the fin structure 230 fit a gap between the holder 100 and the circuit board 21 and the base 210 is located opposite to the heat producing element 22. As a result, the heat sink 200 can pivot relative to the substrate 20 via the fin structure 230 from an open configuration (FIG. 3B) to a closed configuration (FIG. 3A). When the heat sink 200 stays in a closed configuration with respect to the substrate 20, the heat producing element 22 is covered by the base 210.

The construction and assembly of heat sink 200 will be described in greater detail. Each of the heat pipes 220 has a conduction portion 221 and a heat dissipation portion 222 both connected with each other, and the fin structure 230 has a plurality of through holes corresponding to each of the heat pipes 220. Each heat pipe 220 is joined to the fin structure 230 with its heat dissipation portion 222 inserted through the corresponding through hole. Also, the conduction portion 221 of the heat pipe 220 penetrates and is fixed firmly to the base 210. In this manner, the heat sink 200 having the base 210, heat pipes 220, and fin structure 230 is formed into an integral whole (FIG. 2).

The fin structure 230 includes a main body 231 and a moving part 232. The main body 231 is composed of a plurality of fins in stacks, and the moving part 232, which is located at the side far away from the base 210, has an erection section 2321 and a constraint section 2322 connected with each other and respectively disposed against two adjacent side surfaces of the main body 231 (FIG. 2). The moving part 232 is thus L-shaped, but this is only exemplary. The erection section 2321 is provided with a plurality of positioning holes 2323 corresponding respectively to the plurality of through holes of the main body 231. The heat dissipation portion 222 of each heat pipe 220 is inserted into both the corresponding through hole and positioning hole 2323 with an end thereof exposed from the moving part 232 for firmly combining the heat pipe 220 to the main body 231.

Further, configuration and assembly of the holder 100 and the moving part 232 of the fin structure 230 will be explained below. An opening 110 is provided on each of the two opposite side plates of the holder 100, and a shaft 233 including a tab 2331 extended from the erection section 2321 and a fastener 2332 fastened to the tab 2331 through the opening 110 is provided to the moving part 232 at each of the two opposite ends. During assembling, the tab 2331 of the shaft 232 is set in opposition to the opening 110, and the fastener 2332 is used to fastened to the tab 2331 through the opening 110 by way of locking or clipping or the like. For example, the fastener 2332 may have one end with a larger diameter than the opening 110 and the other end with a smaller diameter than the opening 110. In this way, the two opposite side plates of the holder 100 can only move in a limited manner between the tab 2331 and the fastener 2332, and the moving part 232 can be pivoted on the holder 100 by the fastener 2332. Accordingly, when driven by the moving part 232, the heat sink 200 is allowed to move with respect to the substrate 20 from an open configuration to a closed configuration with the fastener 2332 acting as a pivot.

According to the above construction, when the heat sink 200 stays in a closed configuration, the base 210 of the heat sink 200 is in contact with the heat producing element 22, so that the heat generated by the heat producing element 22 can be conducted to the heat pipe(s) 220 and the fin structure 230.

In addition, since the bottom of the fin structure 230 also comes into contact with the substrate 20 under this situation, the heat received by the fin structure 230 can be conducted more rapidly to the housing, thereby achieving a better heat dissipation efficiency.

A plurality of screws 213 and screw holes for example may be provided to the base 210 optionally for further fastening the base 210 to the circuit board 21. As a result, the base 210 may contact more completely with the heat producing element 22, facilitating the heat transfer effect. However, it should be understood that the screws 213 are illustrative rather than limitative; one skilled in the art may select other appropriate fastening means.

In an opposite way, when the screws 213 are unscrewed, the moving part 232 is allowed to pivot on the holder 100, leading the heat sink 200 to be in an open configuration with respect to the substrate 20. The heat producing element 22 is separate and exposed from the base 210. Therefore, the heat producing element 22 may be replaced or maintained easily and conveniently without disassembling the entire heat sink 200 from the substrate 20.

In a second embodiment, the heat dissipation module 10 is similar to the that in the first embodiment in the construction except the differences listed below.

Figure 4:
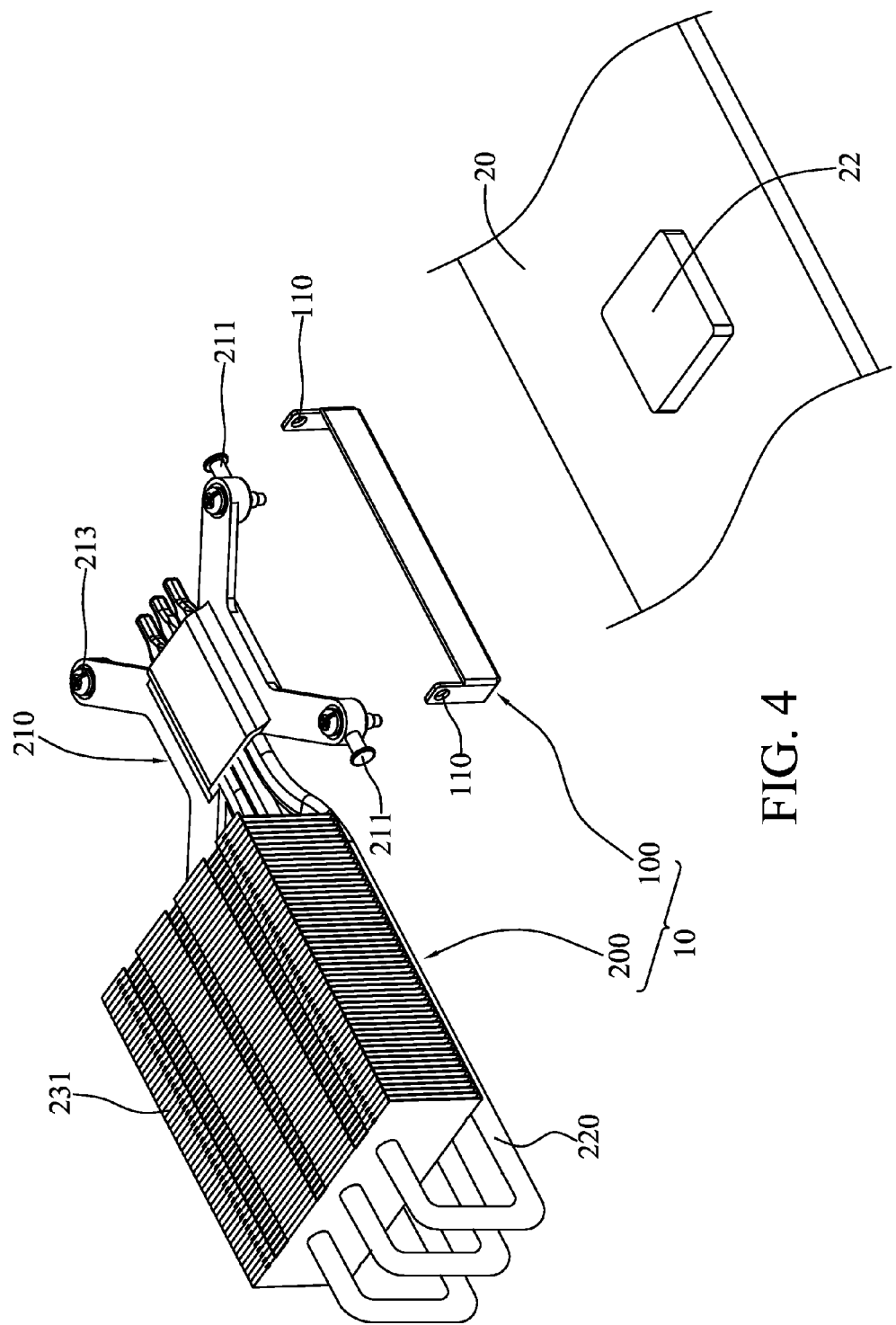
FIG. 4 is an exploded view of the heat dissipation module according to a second embodiment of the present invention.
Figure 5:
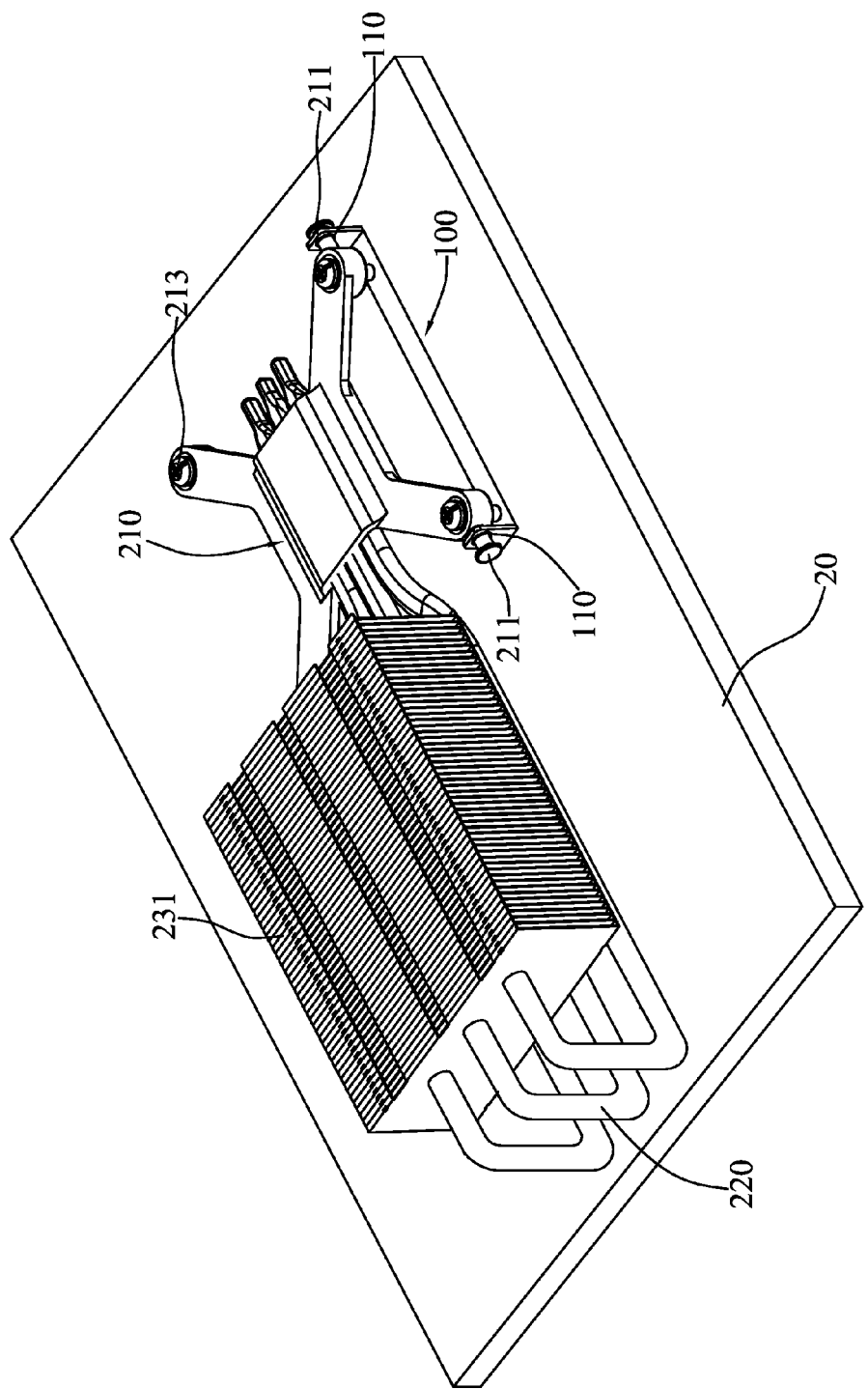
FIG. 5 is an assembling view of the heat dissipation module according to the second embodiment of the present invention.
Figure 6A:
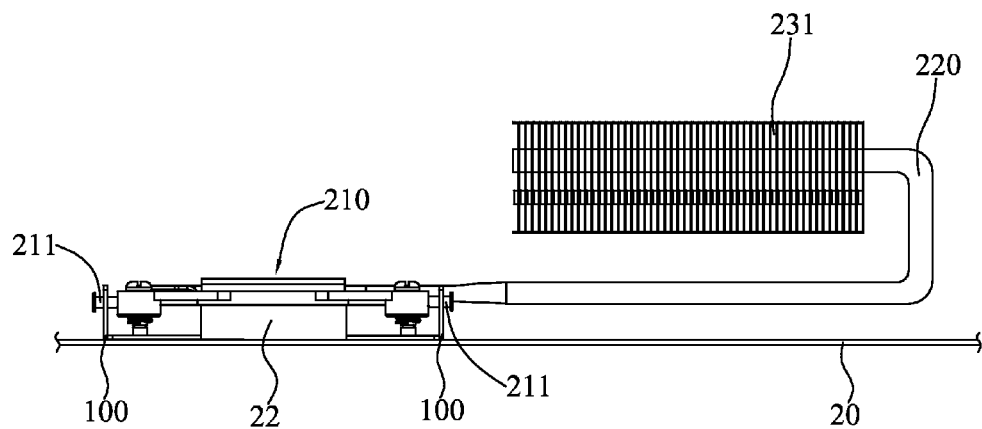
FIGS. 6A and 6B are schematic side view illustrating usage of the heat dissipation module according to the second embodiment of the present invention.
Figure 6B:
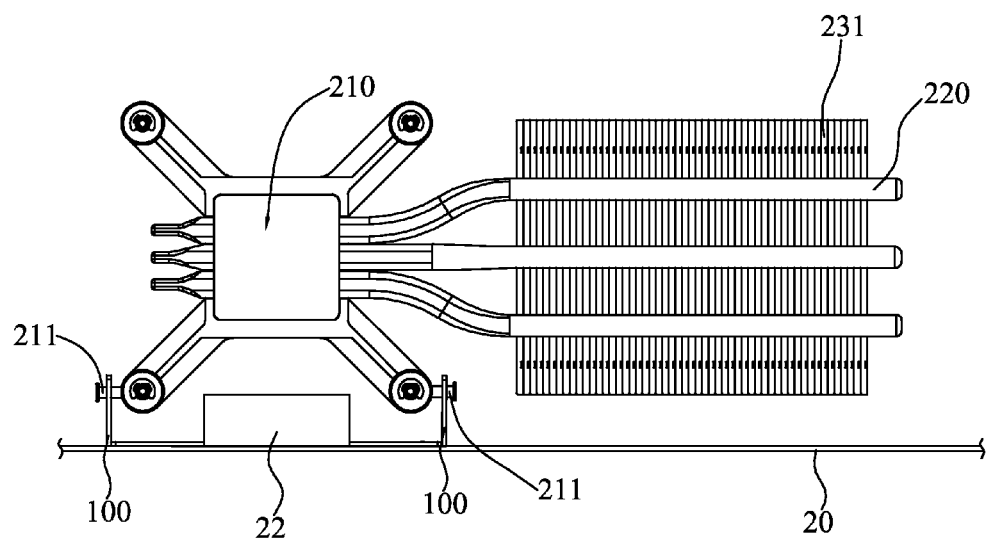

FIGS. 4 to 6 are respectively an exploded view, assembling view, and side view of the heat dissipation module 10 according to the second embodiment of the present invention. The heat dissipation module 10 is configured on a substrate 20 of an electronic device for dissipating heat generated by a heat producing element 22 on the substrate 20 that is a motherboard or circuit board with a heat producing element 22 disposed thereon.

The differences between the heat dissipation module 10 of the second embodiment and that of the first embodiment are described now. The former includes a holder 100 and a heat sink 200. The holder 100 is disposed on a side of the substrate 20 adjacent to the heat producing element 22 and has an opening 110 on each of the two opposite side plates thereof; that is, the holder 100 is mounted on the motherboard or circuit board directly. The heat sink 200 includes a base 210, a fin structure 230, and a plurality of heat pipes 220 connected therebetween in a form of U-shape, resulting in the fin structure 230 hung above the base 210.

It is to be noted that two pillars 211 are provided to the base 210 to be inserted into the two opposite openings 110 of the holder 100 respectively. The pillar 211 may be, but not limited to, a cylinder extending from the edge of the base 210 and has an axle in a direction perpendicular to the arrangement of the heat pipes 220. In this way, similarly, the heat sink 200 is allowed to move from an open configuration to a closed configuration relative to the substrate 20 with the two pillars 211 serving as a pivot on the holder 100. The base 210 is adjustable to cover and contact with or separate from the heat producing element 22. Therefore, the construction of the heat dissipation module 10 in the second embodiment can also realize the same purpose as in the first embodiment to replace or maintain the heat producing element 22 easily and convenient during a short period of time without disassembling the entire heat sink 200.

However, it should be appreciated that in the second embodiment, the heat sink 200 moves from an open configuration to a closed configuration relative to the substrate (motherboard) 20 in a different pivotal direction from the first embodiment (i.e., in a direction parallel to the arrangement of the heat pipes). Thus, when the heat sink 200 stays in a closed configuration relative to the substrate 20, the base 210 comes into contact with the heat producing element 22, while the fin structure 230 is spaced apart from the substrate 20. The fact that the fin structure 230 does not come into contact with the motherboard 20 helps to prevent the heat received by the fin structure 230 from accumulating on the motherboard 20. Also, the heat sink 200 of this feature may be applied artfully to the electronic devices having different internal arrangements or dispositions.

From the above embodiments, it is obvious that with the pivotal connection between the heat sink and the holder, the heat sink of the present invention enables an easy assembly and disassembly from the electronic device and facilitates the replacement of the chips like CPU or GPU located around the heat dissipation module by pivoting about the substrate, such as a circuit board, from an open configuration to a closed configuration. Because the need of detaching the whole heat dissipation module as in prior art is eliminated, it is convenient and time-saving for a DIY repair user or homebuilt computer user.

From the above description of the invention, it is manifest that various techniques can be used for implementing the concepts of the invention without departing from the scope thereof. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It is intended that the scope of the invention is defined by the appended claims.

What is claimed is:

1. A heat dissipation module configured on a substrate having a heat producing element thereon, comprising:
   a holder configured on the substrate and having two side plates opposite to each other; and
   a heat sink comprising a base opposite to the heat producing element, a fin structure, and at least one heat pipe connected between the base and the fin structure,
   wherein the heat sink is pivotally connected to the holder to pivot with respect to the substrate from an open configuration to a closed configuration, and when the heat sink is in the closed configuration with respect to the substrate, the heat producing element is covered by the base;
   wherein the fin structure has two shafts respectively pivoted to the two side plates of the holder, and comprises a main body and a moving part to be fastened to the main body, and the two shafts are respectively located at two opposite ends of the moving part; wherein the moving part has an erection section and a constraint section connected with each other and respectively disposed against two adjacent side surfaces of the main body, the two shafts are located at two opposite ends of the erection section respectively, the erection section has at least one positioning hole, and the heat pipe has a conduction portion connected with the base and a heat dissipation portion connected between the main body and the erection section of the moving part and inserted into the positioning hole.

2. The heat dissipation module of claim 1, wherein an opening is provided on each of the two opposite side plates of the holder, the shaft comprises a tab extended from the erection section and a fastener fastened to the tab through the opening.

3. A heat dissipation module configured on a substrate having a heat producing element thereon, comprising:
   a holder configured on the substrate and having two side plates opposite to each other; and
   a heat sink comprising a base opposite to the heat producing element, a fin structure, and at least one heat pipe connected between the base and the fin structure,
   wherein the heat sink is pivotally connected to the holder to pivot with respect to the substrate from an open configuration to a closed configuration, and when the heat sink is in the closed configuration with respect to the substrate, the heat producing element is covered by the base; wherein two openings are provided on each of the two opposite side plates of the holder, and two pillars are provided to the base of the heat sink to be inserted into the two openings of the holder respectively.

4. The heat dissipation module of claim 1, wherein when the heat sink is in the closed configuration with respect to the substrate, the fin structure comes into contact with the substrate.

* * * * *